US006642561B2

(12) United States Patent
Kakumoto et al.

(10) Patent No.: US 6,642,561 B2
(45) Date of Patent: Nov. 4, 2003

(54) SOLID IMAGING DEVICE AND METHOD FOR MANUFACTURING THE SAME

(75) Inventors: Tomokazu Kakumoto, Nagaokakyo (JP); Yoshio Hagihara, Amagasaki (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/858,084

(22) Filed: May 15, 2001

(65) Prior Publication Data

US 2002/0008217 A1 Jan. 24, 2002

(30) Foreign Application Priority Data

May 16, 2000 (JP) ........................................ 2000-143757

(51) Int. Cl.[7] ........................ H01L 27/146; H01L 27/12

(52) U.S. Cl. ........................ 257/292; 257/347; 257/435; 438/510

(58) Field of Search ................................ 257/291, 292, 257/347

(56) References Cited

U.S. PATENT DOCUMENTS

| | | | | |
|---|---|---|---|---|
| 5,523,610 A | | 6/1996 | Kudo et al. | 257/443 |
| 5,877,521 A | * | 3/1999 | Johnson et al. | 257/291 |
| 6,380,571 B1 | * | 4/2002 | Kalnitsky et al. | 257/292 |

* cited by examiner

*Primary Examiner*—Gene M. Munson
(74) *Attorney, Agent, or Firm*—Sidley Austin Brown & Wood LLP

(57) ABSTRACT

A solid imaging device comprises a substrate including a semiconductor layer, a middle layer and a support layer, multiple pixels that each have a photoelectric conversion unit that includes a diffusion layer formed on the surface of the semiconductor layer, and insulating areas that are located such that they reach from the surface of the semiconductor layer to the middle layer and work together with the middle layer to electrically separate the pixels from each other.

13 Claims, 6 Drawing Sheets

SOLID IMAGING DEVICE AND METHOD FOR MANUFACTURING THE SAME

This application is based on application No. 2000-143757 filed in Japan, the content of which is hereby incorporated by reference.

BACKGROUND OF THE INVENTION

1. Field of the Invention

The present invention relates to a solid imaging device, a method for manufacturing the same and more particularly to a MOS solid imaging device.

2. Description of the Related Art

A two-dimensional solid imaging device (A two-dimensional solid state image pickup device), which comprises a matrix of pixels that each comprise a photoelectric conversion element such as a photodiode and a means that extracts the photoelectric charge generated by the photoelectric conversion element to output signal lines, is used in various applications. Such solid imaging devices may be roughly divided into CCD-type and MOS-type devices depending on the means that reads (extracts) the photoelectric charge generated by the photoelectric,conversion element. A CCD-type device transfers the photoelectric charge while accumulating it in potential wells, and has the shortcoming of a small dynamic range. On the other hand, a MOS-type device directly reads the charge accumulated in the pn junction capacitance of the photodiode through MOS transistors.

FIG. 10 shows the construction of a pixel in a conventional MOS solid imaging device. In this drawing, PD represents a photodiode, and its cathode is connected to the gate of the MOS transistor T11 as well as to the source of the MOS transistor T12. The source of the MOS transistor T11 is connected to the drain of the MOS transistor T13, and the source of the MOS transistor T13 is connected to the output signal line Vout. A DC voltage VPD is impressed to the drains of the MOS transistors T11 and T12, and a DC voltage VPS is impressed to the anode of the photodiode.

When light strikes the photodiode PD, photoelectric charge is generated, which is accumulated in the gate of the MOS transistor T11. When a pulse signal $\phi$V is supplied to the gate of the MOS transistor T13 to turn the MOS transistor T13 ON, an electric current proportional to the charge in the gate of the MOS transistor T11 is drawn to the output signal line via the MOS transistors T11 and T13. An output current proportional to the amount of incident light may be read out in this way. After the signal is read, the gate voltage of the MOS transistor T11 may be initialized by turning OFF the MOS transistor T13 and turning ON the MOS transistor T12.

A MOS solid imaging device having the above pixel construction is designed and manufactured using the same processes as for standard C-MOS LSI chips. Therefore it may be integrated with other processing circuits and may be handled as a one-chip integrated circuit device. In addition, by having the MOS transistor T11 operate as a source follower MOS transistor, the signals obtained from the photodiode PD may be amplified and noise may be reduced.

However, as shown in FIG. 10, a minimum of three MOS transistors must be included per pixel. This limits the area of the substrate of such a solid imaging device that may comprise the photodiode, which in turn limits the ratio of the light receiving area to the imaging area. In order to increase this ratio, a CMD (Charge Modulation Device) has been proposed in which each pixel comprises one MOS phototransistor that accumulates in a MOS capacitor the charge obtained through photoelectric conversion, but it has the shortcoming that the manufacturing process for such a device is more complex than the standard C-MOS LSI manufacturing process because unlike the MOS solid imaging device shown in FIG. 10, MOS phototransistors must be formed.

SUMMARY OF THE INVENTION

In view of these problems, the object of the present invention is to provide a solid imaging device with a larger light receiving area to imaging area ratio than may be manufactured using the standard C-MOS LSI manufacturing process.

In order to attain the above object, the solid imaging device of the present invention comprises a substrate including a semiconductor layer, a middle layer and a support layer, multiple pixels that each have a photoelectric conversion unit that includes a diffusion layer formed on the surface of the semiconductor layer, and insulating areas that are located such that they reach from the surface of the semiconductor layer to the middle layer and work together with the middle layer to electrically separate the pixels from each other.

In this solid imaging device, the insulating areas that are formed such that they reach the middle layer and the middle layer electrically separate each pixel, and the electric charge generated by the photoelectric conversion unit of each pixel is prevented from moving to the adjacent pixels.

Furthermore, in this solid imaging device, the middle layer may be formed using an insulating material, or using a semiconductor material having the opposite polarity from the semiconductor layer. In the latter case, each pixel may be electrically separated by impressing a prescribed DC voltage to the middle layer, which is formed of a semiconductor material having the opposite polarity from the semiconductor layer.

It is also acceptable if diffusion layers having the opposite polarity from the semiconductor layer are located such that they reach from the surface of the semiconductor layer to the middle layer. A prescribed DC voltage may be supplied to the middle layer on an individual pixel basis via the diffusion layers thus formed.

The pixel may also be constructed such that it includes first through fourth diffusion layers that each have the opposite polarity from the semiconductor layer and are aligned on the surface of the semiconductor layer, as well as a first insulating film located on the semiconductor layer between the first and second diffusion layers, a second insulating film located on the semiconductor layer between the third and fourth diffusion layers, a first electrode film located on the first insulating film, and a second electrode film located on the second insulating film, wherein the photoelectric conversion unit comprises the second diffusion layer and the semiconductor layer and has a first electrode and a second electrode.

The pixel also includes a first MOS transistor comprising the first diffusion layer, the second diffusion layer, the first insulating film and the first electrode film, and a second MOS transistor comprising the third diffusion layer, the fourth diffusion layer, the second insulating film and the second electrode film. The first and second MOS transistors each have a first electrode, a second electrode and a gate electrode.

Furthermore, the pixel may also be constructed such that (i) the first electrode of the first MOS transistor is connected to the first electrode of the photoelectric conversion element, (ii) the back gate of the first MOS transistor is connected to the second electrode of the photoelectric conversion element such that the first MOS transistor outputs signals from the second electrode, and (iii) the first electrode and the back gate of the second MOS transistor are connected to the second electrode of the photoelectric conversion element such that a reset DC voltage is impressed to the second electrode of the second MOS transistor.

When light strikes the pixel in this solid imaging device, electric charge is accumulated in the second electrode of the photoelectric conversion element, and the voltage of the back gate of the first MOS transistor varies depending on the amount of incident light. When the first MOS transistor is turned ON, an electric signal corresponding to the amount of incident light is output from the second electrode of the first MOS transistor. When the second MOS transistor is turned ON, the voltages of the second electrode of the photoelectric conversion element and the back gate of the first MOS transistor are initialized based on the reset DC voltage impressed to the second electrode of the second MOS transistor.

In addition, by forming the second and third diffusion layers such that they do not reach the middle layer, the semiconductor layer on the middle layer may comprise the back gates of the first and second MOS transistors and the second electrode of the photoelectric conversion element.

Therefore, when light strikes the pixel, electric charge is accumulated in the semiconductor layer, and based on the change in the potential of the semiconductor layer in accordance with the amount of incident light, an output corresponding to the amount of incident light may be obtained from the second electrode of the first MOS transistor. In addition, when a reset DC voltage is impressed to the semiconductor layer via the second electrode of the second MOS transistor, the electric charge accumulated in the semiconductor layer undergoes positive-negative recombination and the semiconductor layer is initialized, whereby the back gate of the first MOS transistor and the second electrode of the photoelectric conversion element are initialized.

Furthermore, by forming the first, second, third and fourth diffusion layers such that they do not reach the middle layer, the semiconductor layer on the middle layer may comprise the back gates of the first and second MOS transistors and the second electrode of the photoelectric conversion element. In addition, because the first and second electrodes of the first and second MOS transistors may be electrically separated from the middle layer, the prescribed voltage impressed to the middle layer does not affect them, such that each pixel may be individually operated.

Therefore, when light strikes the pixel, electric charge is accumulated in the semiconductor layer, and based on the change in the potential of the semiconductor layer in accordance with the amount of incident light, an output corresponding to the amount of incident light may be obtained from the second electrode of the first MOS transistor. In addition, when a reset DC voltage is impressed to the semiconductor layer via the second electrode of the second MOS transistor, the electric charge accumulated in the semiconductor layer undergoes positive-negative recombination and the semiconductor layer is initialized, whereby the back gate of the first MOS transistor and the second electrode of the photoelectric conversion element are initialized.

Furthermore, an insulating area that reaches from the surface of the semiconductor layer to the middle layer may be added between the second and third diffusion layers.

The polarity of the semiconductor substrate is P.

The pixels are aligned in a matrix fashion.

These and other objects, advantages and features of the invention will become apparent from the following description thereof taken in conjunction with the accompanying drawings which illustrate specific embodiments of the invention.

BRIEF DESCRIPTION OF THE DRAWINGS

In the following description, like parts are designated by like reference numbers throughout the several drawings.

DESCRIPTION OF THE PREFERRED EMBODIMENTS

Figure 1:
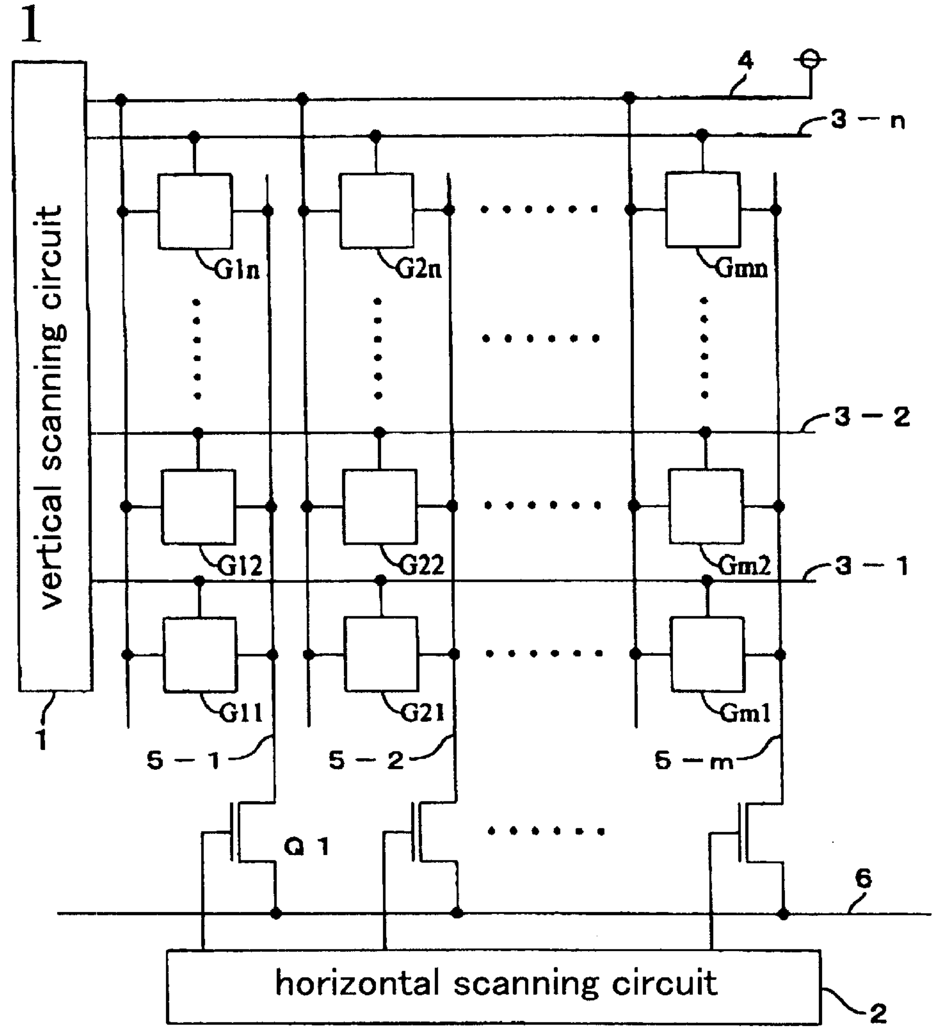
FIG. 1 is a block diagram showing the internal construction of the solid imaging device of the present invention.

The construction of the solid imaging device of the present invention will first be explained with reference to the drawings. FIG. 1 is a block diagram showing the internal construction of the solid imaging device of the present invention. FIG. 1 shows in a summary fashion the construction of part of a two-dimensional MOS solid imaging device comprising a first embodiment of the present invention.

In FIG. 1, G11 through Gmn represent pixels that are aligned in a matrix fashion. Vertical scanning circuit 1, sequentially scans the lines 3-1, 3-2, . . . 3-n. Horizontal scanning circuit 2, reads on a pixel basis and in horizontal sequential order the photoelectric conversion signals led into the output signal lines 5-1, 5-2, . . . 5-m from the pixels. 4 Also shown is a power line 4. Other lines (such as clock lines and bias supply lines, for example) are also connected to the pixels besides the lines 3-1, 3-2, . . . 3-n, the output signal lines 5,-1, 5-2, . . . 5-m and the power line 4, but these lines are omitted from FIG. 1, though they are indicated in the pixel circuit diagram shown in FIG. 2.

One N-channel MOS transistor Q1 is located for each output signal line 5-1, 5-2, . . . 5-m, as shown in the drawing. To explain, using the output signal line 5-1 as an example, the drain of the MOS transistor Q1 is connected to the output signal line 5-1, while the source and gate thereof are connected to the final signal line 6 and the horizontal scanning circuit 2, respectively. As described below, each pixel has an N-channel MOS transistor T1 for switching purposes. Here the MOS transistor T1 performs line selection and the transistor Q1 performs column selection.

Figure 2:
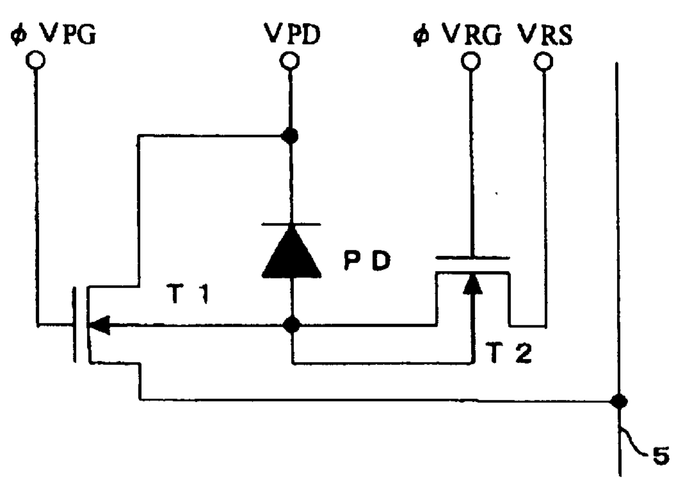
FIG. 2 is a circuit diagram showing the construction of a pixel in the solid imaging device shown in FIG. 1.

The circuit construction of the pixels G11 through Gmn in the solid imaging device having the construction shown in FIG. 1 will now be explained with reference to the drawings. FIG. 2 is a circuit diagram showing the construction of each pixel in the solid imaging device shown in FIG. 1.

The pixel shown in FIG. 2 has a pn photodiode PD comprising a photosensitive unit (photoelectric conversion unit), an N-channel MOS transistor T1, the drain of which is impressed with a DC voltage VPD that is also impressed to the cathode of the photodiode PD, and an N-channel MOS transistor T2, the back gate and drain of which are connected to the back gate of the MOS transistor T1 as well as to the anode of the photodiode PD. A signal ϕVPG is impressed to the gate of the MOS transistor T1, while the source thereof is connected to the output signal line 5 (equivalent to the output signal lines 5-1 through 5-n in FIG. 1). A signal ϕVRG is impressed to the gate of the MOS transistor T2, while the source thereof is impressed with a DC voltage VRS having a lower voltage level than the DC voltage VPD.

Figure 3:
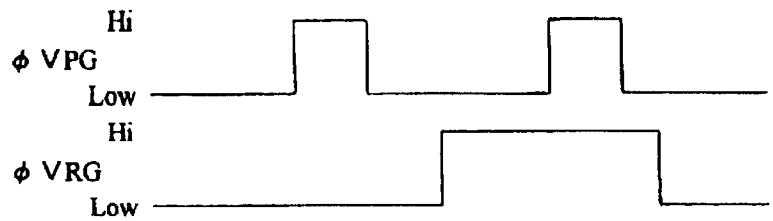
FIG. 3 is a timing chart showing the operation of the pixel shown in FIG. 2.

The pixel having the above construction performs an imaging operation when the signal ϕVRG is low, as shown in FIG. 3. When the signal level is low, if light strikes the photodiode PD, positive charge is accumulated on the anode side of the photodiode PD in accordance with the amount of incident light. Therefore, the larger the amount of incident light, the greater the increase in the potential on the anode side of the photodiode PD. With this increase, the potential of the back gate of the MOS transistor T1, which is connected to the anode of the photodiode PD, also increases.

When a pulse signal ϕVPG is supplied to the gate of the MOS transistor T1, a current that is determined based on the back gate voltage of the MOS transistor T1 begins to be drawn to the output signal line 5 via the MOS transistor T1. Because the voltage of the pulse signal ϕVPG supplied to the gate of the MOS transistor T1 is constant here, the higher the back gate voltage of the MOS transistor T1, the lower the voltage between the gate and the back gate, and the lower the amount of source current drawn to the MOS transistor T1. Therefore, the larger the amount of incident light, the lower the amount of output current drawn to the output signal line 5. The output current output to the output signal line 5 in this way is output as an image signal.

The signal ϕVPG is then made low to turn OFF the MOS transistor T1, and the signal ϕVRG is then made high to turn ON the MOS transistor T2. As a result, the positive charge accumulated in the anode of the photodiode PD as well as in the back gate of the MOS transistor T1 is recombined with the negative charge entering from the source of the MOS transistor T2, whereby the potential of the back gate of the MOS transistor T1 and the anode of the photodiode PD becomes initialized to the DC voltage VRS.

A pulse signal ϕVPG is then supplied to the gate of the MOS transistor T1 so as to output to the output signal line 5 the output current when the potentials of the back gate of the MOS transistor T1 and the anode of the photodiode PD are thus initialized. Where the output current output to the output signal line 5 is given to the down stream circuit as a noise signal, the signal ϕVPG is made low, as is the signal ϕVRG. If the previously output image signal is corrected based on this noise signal in the downstream circuit (not shown in the drawings), an image signal by which sensitivity variations among the pixels can be reduced may be obtained.

Figure 9:
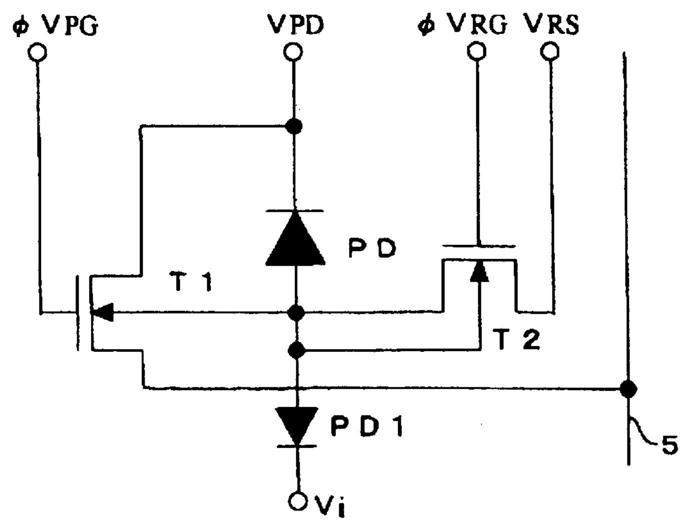
FIG. 9 is a circuit diagram showing the construction of a pixel in the solid imaging device shown in FIG. 1.
Figure 10:
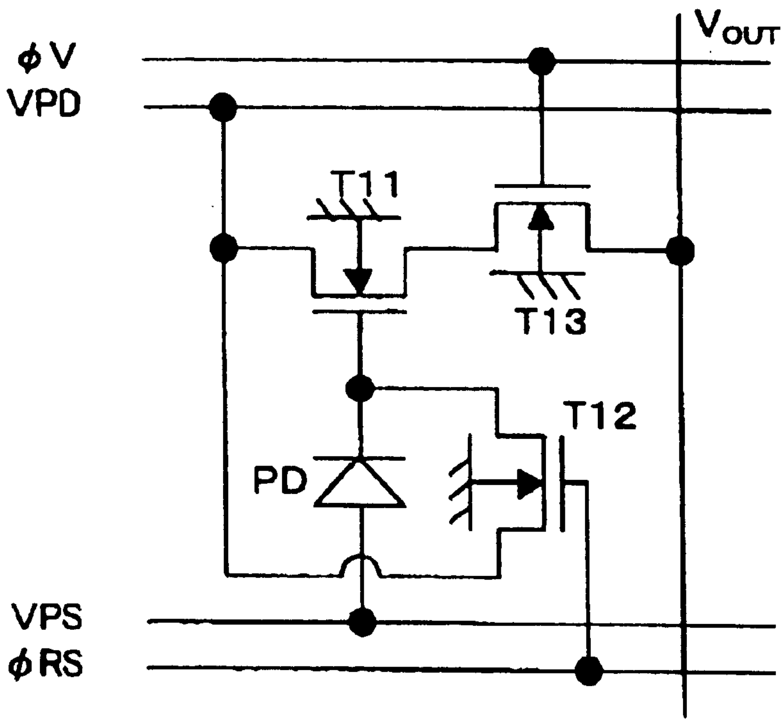
FIG. 10 is a circuit diagram showing the construction of a pixel in a conventional solid imaging device.

The internal construction of the solid imaging device described above and the circuit construction of a pixel are identical in each embodiment described below. While discussed in more detail below, where a semiconductor substrate is used in which an insulating layer is embedded as a middle layer, as in the first and third embodiments, the connection node of the back gates of the MOS transistors T1 and T2 and the anode of the photodiode PD have a floating potential, as shown in FIG. 2.

Where a semiconductor substrate is used in which an N-type embedded layer to which a DC voltage Vi is impressed is embedded as a middle layer, as in the second and fourth embodiments, a DC voltage Vi is impressed to the connection node of the back gates of the MOS transistors T1 and T2 and the anode of the photodiode PD via the diode PD1, as shown in FIG. 9. The diode PD1, regarding which the cathode is impressed with a DC voltage Vi and the anode is connected to connection node of the back gates of the MOS transistors T1 and T2 and the anode of the photodiode PD, prevents current reflux to the connection node of the back gate of the MOS transistors T1 and T2 and the anode of the photodiode PD.

The semiconductor substrate construction for each pixel in the solid imaging device of each embodiment is explained below.

First Embodiment

Figure 4:
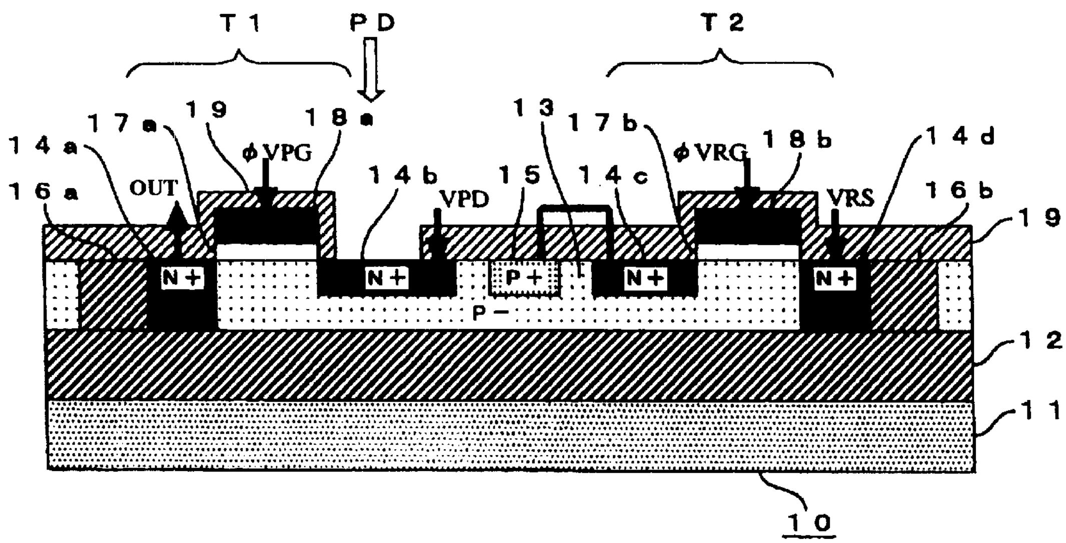
FIG. 4 is a cross-sectional view showing the construction of a pixel of a first embodiment.

FIG. 4 is a cross-sectional view of the construction of each pixel in the solid imaging device of this embodiment. In order to facilitate understanding, wiring and correlative insulating films on the substrate are omitted from the drawing in FIG. 4. This applies to the second through fourth embodiments as well. In this embodiment, the internal construction of the solid imaging device and the circuit construction of each pixel are as shown in FIGS. 1 and 2 and described above. The operation of each pixel is as shown in the timing chart of FIG. 3.

As shown in FIG. 4, in this embodiment, the pixels are formed in an SOI (Silicon On Insulator) substrate 10 comprising a $SiO_2$ layer having an embedded insulating layer 12. This SOI substrate 10 comprises a silicon substrate 11, which works as a support layer, and an $SiO_2$ insulating layer 12, which works as a middle layer, as well as a P-type silicon layer 13 formed on the insulating layer 12. In this SOI substrate 10, MOS transistors T1 and T2 and photodiodes PD that comprise the pixels are formed on the P-type silicon layer 13.

The P-type silicon layer 13 on which MOS transistors T1 and T2 and photodiodes PD are formed includes N-type diffusion layers 14*a*, 14*b*, 14*c* and 14*d*, which are sequentially aligned, as well as a P-type diffusion layer 15, which is located between the N-type diffusion layers 14*b* and 14*c*. In order to comprise one pixel using the area from the N-type diffusion layer 14*a* to the N-type diffusion layer 14*d* and prevent electrical connection with adjacent pixels, insulating layers 16 (shown as 16*a* and 16*b* in FIG. 4) made of the same $SiO_2$ as the insulating layer 12 are located outside the N-type diffusion layers 14*a* and 14*d* such that they surround the pixel.

In addition, between the N-type diffusion layers 14*a* and 14*b*, an $SiO_2$ insulating film 17*a* is located on the surface of the P-type silicon layer 13, and a polysilicon unit 18*a*, which works as an electrode film, is located on the surface of the insulating film 17*a*. Similarly, between the N-type diffusion layers 14*c* and 14*d*, an $SiO_2$ insulating film 17*b* is located on the surface of the P-type silicon layer 13, and a polysilicon unit 18*b*, which works as an electrode film, is located on the surface of the insulating film 17*b*. Furthermore, an aluminum shielding film 19 is placed on the surface of the SOI substrate 10, which includes the above layers, such that it covers the entire surface of the substrate except for the N-type diffusion layer 14*b*, which works as a photosensitive unit. The N-type diffusion layers 14*b* and 14*c* are formed such that they do not reach the insulating layer 12. The shielding film 19 is formed on the surface of the SOI substrate 10 such that it does not cover the N-type diffusion layer 14*b*.

In a pixel having this substrate construction, the N-type diffusion layer 14*a* comprises the source of the MOS transistor T1, the N-type diffusion layer 14*c* comprises the drain of the MOS transistor T2, and the N-type diffusion layer 14*d* comprises the source of the MOS transistor T2. The N-type diffusion layer 14*b* comprises the cathode of the photodiode PD as well as the drain of the MOS transistor T1.

The polysilicon units 18*a* and 18*b* comprise the gate electrodes of the MOS transistors T1 and t2, respectively. The P-type diffusion layer 13 between the N-type diffusion layers 14*a* and 14*d* comprises the anode of the photodiode PD and the back gates of the MOS transistors T1 and T2. Therefore, the output signal line 5 is connected to the N-type diffusion layer 14*a* and DC voltages VPD and VRS are impressed to the N-type diffusion layers 14*b* and 14*d*, respectively. The P-type diffusion layer 15 and the N-type diffusion layer 14*c* are externally connected electrically, and signals ϕVPG and ϕVRG are given to the polysilicon units 18*a* and 18*b*.

Where each pixel has the above construction, when light strikes the N-type diffusion layer 14*b*, which comprises a photosensitive unit, photoelectric conversion is carried out by the photodiode PD, which consists of the N-type diffusion layer 14*b* and the P-type silicon layer 13, and an electric charge is generated. Negative charge is drawn to the DC voltage line that is connected to the N-type diffusion layer 14*b* and that supplies DC voltage VPD, and positive charge remains in the P-type silicon layer 13. Therefore the potential of the P-type silicon layer 13 increases, and as a result, the voltage of the anode of the photodiode PD and of the back gates of the MOS transistors T1 and T2 increases. Consequently, when a pulse signal ϕVPG is supplied to the polysilicon unit 18*a*, a source current determined by the potential of the P-type silicon layer 13 is drawn from the N-type diffusion layer 14*b* to the N-type diffusion layer 14*a*, and is output to the output signal line 5 as an output current. When this occurs, the signal ϕVRG is made low.

When a high-level signal ϕVRG is supplied to the polysilicon unit 18*b*, negative charge is drawn from the DC voltage line that supplies DC voltage VRS to the N-type diffusion layer 14*d*, and consequently, the positive charge remaining in the P-type silicon layer 13 recombines with it, whereupon the potential of the P-type silicon layer 13 is reset to the original status. When this occurs, the signal ϕVPG is made low. After resetting is carried out in this way, a high-level signal ϕVPG is supplied to the gate of the MOS transistor T1 such that the reset output current is output to the output signal line 5. The signal ϕVPG and the signal ϕVRG are then made low in preparation for the next imaging operation.

Figure 5A:
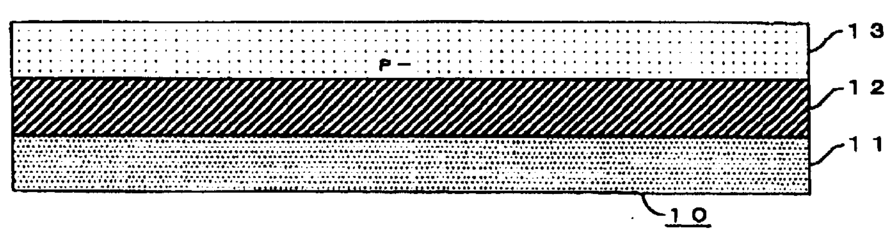
FIGS. 5A, 5B, 5C, 5D, 5E and 5F of are drawings showing the manufacturing process of the solid imaging device having the pixels of the first embodiment.
Figure 5B:
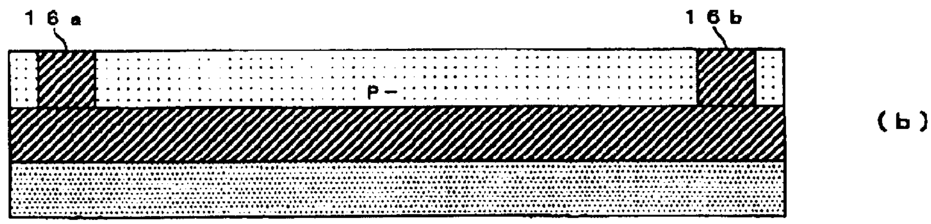
Figure 5C:
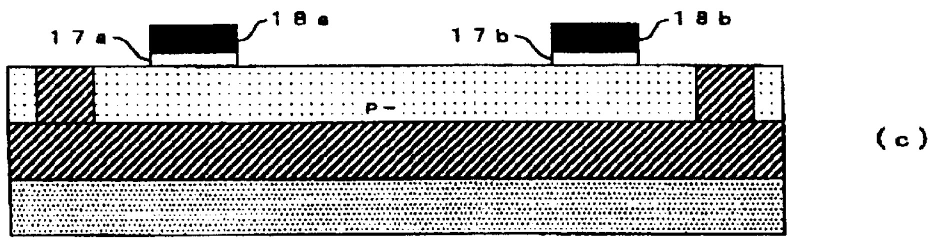

The manufacturing process of the solid imaging device having the above pixel construction will be explained with reference to FIG. 5A through FIG. 5F, which show the manufacturing process for a single pixel. The substrate on which pixels of the solid imaging device are formed comprises, as shown in FIG. 5A, an SOI substrate as described above comprising a silicon substrate 11, an insulating layer 12 located on the silicon substrate 11, and a P-type silicon layer 13 located on the insulating layer 12. Insulating layers 16*a* and 16*b* are first formed in the SOI substrate 10 shown in FIG. 5A in order to separate each pixel area, as shown in FIG. 5B. An oxide film and polysilicon film are grown on the surface of the P-type silicon layer 13, as shown in FIG. 5C, such that they comprise insulating films 17*a* and 17*b* and polysilicon units 18*a* and 18*b*.

Figure 5D:
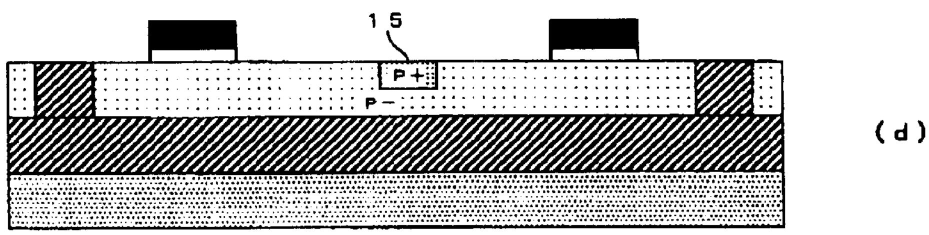
Figure 5E:
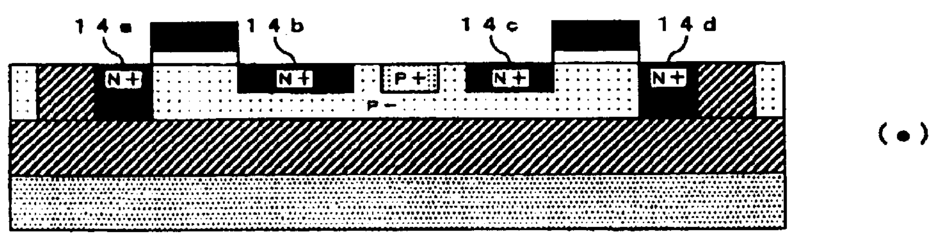

P-type impurity ions are injected in the P-type silicon layer 13 between the insulating films 17*a* and 17*b* to form a P-type diffusion layer 15, as shown in FIG. 5D. Once this P-type diffusion layer 15 is formed, N-type impurity ions are injected in the P-type silicon layers 13 between the insulating layer 16*a* and the insulating film 17*a*, the insulating film 17*a* and the P-type diffusion layer 15, the P-type diffusion layer 15 and the insulating film 17*b* and the insulating film 17*b* and the insulating layer 16*b*, respectively, to form N-type diffusion layers 14*a*, 14*b*, 14*c* and 14*d*, respectively, as shown in FIG. 5E.

Figure 5F:
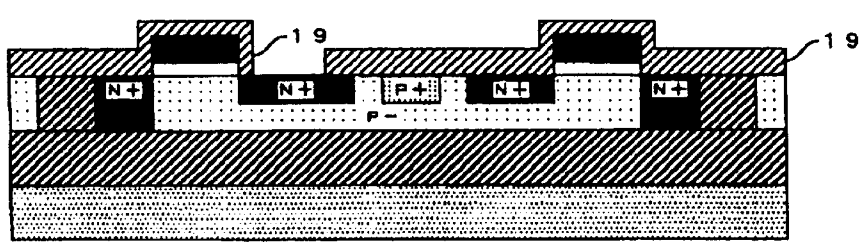

When a photodiode PD and MOS transistors T1 and T2 are made by forming N-type diffusion layers 14*a* through 14*d*, a P-type diffusion layer 15, insulating layers 16*a* and 16*b*, insulating films 17*a* and 17*b* and polysilicon units 18*a* and 18*b* on the SOI substrate 10 in this way, the surface of the SOI substrate 10 is covered with a shielding film 19 except for the area of the N-type diffusion layer 14*b*, which operates as a photosensitive unit, as shown in FIG. 5F.

In this embodiment, while the N-type diffusion layers 14*b* and 14*c* must not reach the insulating layer 12, it does not matter whether or not the N-type diffusion layers 14*a* and 14*d* reach the insulating layer 12.

Second Embodiment

Figure 6:
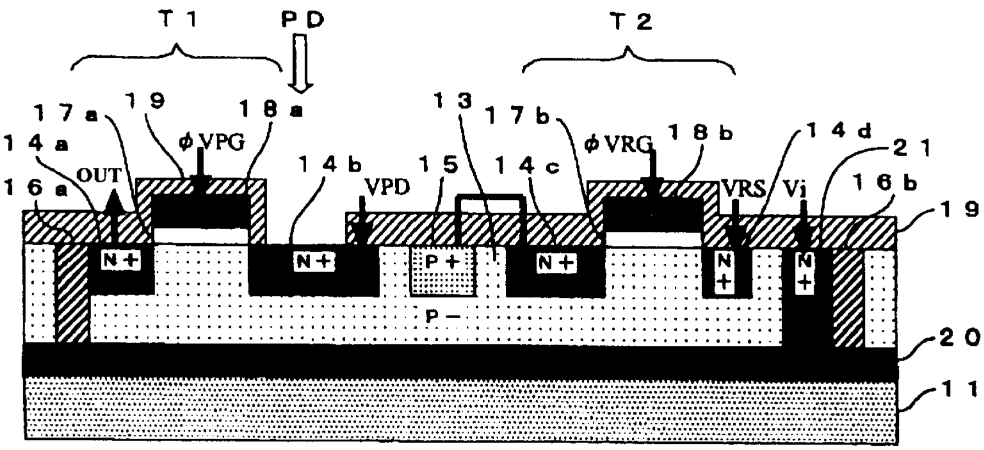
FIG. 6 is a cross-sectional view showing the construction of a pixel of a second embodiment.

FIG. 6 is a cross-sectional view showing the construction of each pixel in the solid imaging device of this embodiment. In this embodiment, the internal construction of the solid imaging device and the circuit construction of each pixel are as shown in FIGS. 1 and 2, as in the case of the first embodiment. The operation of each pixel is also as shown in the timing chart of FIG. 3. In the construction shown in FIG. 6, the same components as indicated in the construction shown in FIG. 4 are assigned the same numbers, and a detailed explanation thereof is omitted.

The substrate for the pixels in this embodiment comprises the substrate of the first embodiment (FIG. 4) except that the insulating layer 12 is replaced with an N-type embedded layer 20, and an N-type diffusion layer 21 is located between the N-type diffusion layer 14*d* and the insulating layer 16*b*, as shown in FIG. 6. The N-type diffusion layer 21 is formed such that it reaches the N-type embedded layer 20, and is impressed with a DC voltage Vi. The N-type diffusion layers 14*a* through 14*d* do not reach the N-type embedded layer 20. Because the operation of the pixel constructed in this way is identical to the operation of the pixel described in connection with the first embodiment, explanation thereof will be omitted and the explanation of the first embodiment should be referred to.

In the substrate having the construction shown in FIG. 6, the area of the P-type silicon layer 13 surrounded by the insulating layers 16*a* and 16*b* and the N-type embedded layer 20 is separated as one pixel when a DC voltage Vi impressed to the N-type diffusion layer 21 is given to the N-type embedded layer 20. The DC voltage Vi here must be made a higher voltage than the DC voltage VPD. Furthermore, because the N-type diffusion layers 14*a* through 14*d* do not reach the N-type embedded layer 20, the DC voltage Vi does not affect the N-type diffusion layers 14*a* through 14*d*.

The manufacturing process of the solid imaging device having-the above pixel construction shown in FIG. 6 basically flows in the order of FIG. 5A through FIG. 5F as in the first embodiment. However, in this embodiment, a silicon substrate (which comprises a supporting silicon substrate 11, an N-type embedded layer 20, which operates as a middle layer, and a P-type silicon layer 13) that includes an N-type embedded layer 20 is used in place of the SOI substrate 10, and an N-type diffusion layer 21 is simultaneously formed when N-type diffusion layers 14a through 14*d* are formed through the injection of N-type ions.

Third Embodiment

Figure 7:
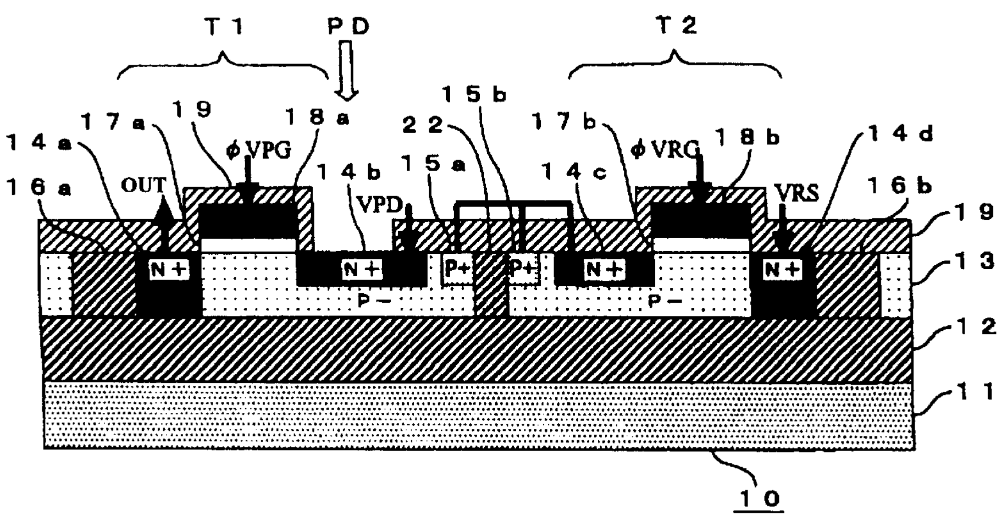
FIG. 7 is a cross-sectional view showing the construction of a pixel of a third embodiment.

FIG. 7 is a cross-sectional view showing the construction of each pixel in the solid imaging device of this embodiment. In this embodiment, the internal construction of the solid imaging device and the circuit construction of each pixel are also as shown in FIGS. 1 and 2, as in the case of the first embodiment. The operation of each pixel is also as shown in the timing chart of FIG. 3. In the construction shown in FIG. 7; the same components indicated in the construction shown in FIG. 4 are assigned the same numbers, and a detailed explanation thereof is omitted.

The substrate for the pixels in this embodiment comprises the substrate of the first embodiment (FIG. 4), but the P-type diffusion layer 15 in the first embodiment is divided into P-type diffusion layers 15*a* and 15*b*, as shown in FIG. 7. In addition, an insulating layer 22, which reaches the insulating layer 12 and is located between the P-type diffusion layers 15*a* and 15*b*, divides the pixel into an area that includes the photodiode PD and MOS transistor T1 and an area that includes the MOS transistor T2. The P-type diffusion layers 15*a* and 15*b* are externally connected electrically with the N-type diffusion layer 14*c*. Because the operation of the pixel constructed in this way is identical to the operation of the pixel described in connection with the first embodiment, explanation thereof will be omitted, and the explanation of the first embodiment should be referred to.

The manufacturing process of the solid imaging device having the above pixel construction shown in FIG. 7 basically proceeds in the order of FIG. 5A through FIG. 5F, as in the first embodiment. However, in this embodiment, the insulating layer 22 is formed at the same time that the insulating layers 16*a* and 16*b* are formed as shown in FIG. 5B, and the P-type diffusion layers 15*a* and 15*b* are formed using the same process used to form the P-type diffusion layer 15 of the first embodiment, i.e., through the injection of P-type ions, as shown in FIG. 5C.

Fourth Embodiment

Figure 8:
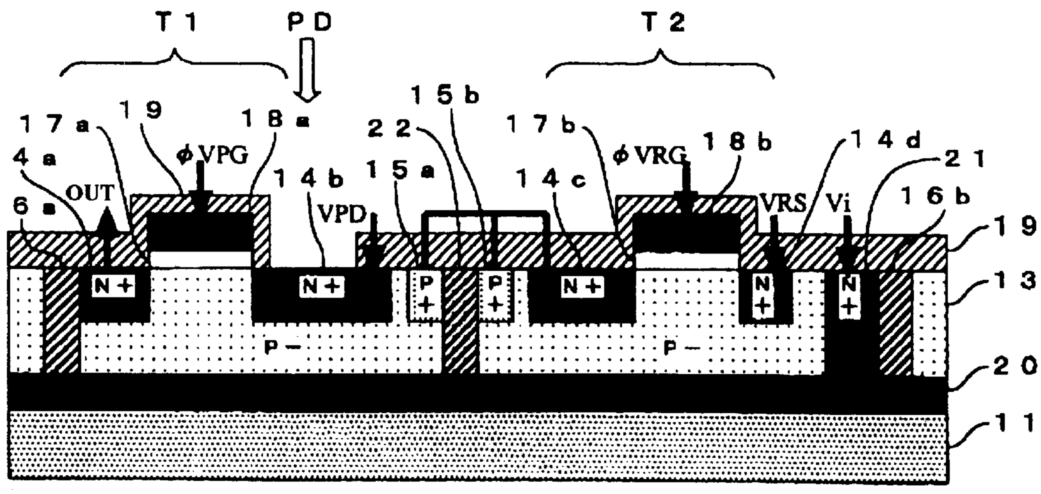
FIG. 8 is a cross-sectional view showing the construction of a pixel of a fourth embodiment.

FIG. 8 is a cross-sectional view showing the construction of each pixel in the solid imaging device of this embodiment. In this embodiment, the internal construction of the solid imaging device and the circuit construction of each pixel are also as shown in FIGS. 1 and 2, as in the case of the first embodiment. The operation of each pixel is also as shown in the timing chart of FIG. 3. In the construction shown in FIG. 8, the same components indicated in the construction shown in FIG. 6 are assigned the same numbers, and a detailed explanation thereof is omitted.

The substrate for the pixels in this embodiment comprises the substrate of the second embodiment (FIG. 6), but the P-type diffusion layer 15 in the second embodiment is divided into P-type diffusion layers 15*a* and 15*b*, as shown in FIG. 8. In addition, an insulating layer 22, which reaches the insulating layer 12 and is located between the P-type diffusion layers 15*a* and 15*b*, divides the pixel into an area that includes the photodiode PD and MOS transistor T1 and an area that includes the MOS transistor T2. The P-type diffusion layers 15*a* and 15*b* are externally connected electrically to the N-type diffusion layer 14*c*. Because the operation of the pixel constructed in this way is identical to the operation of the pixel described in connection with the first and second embodiments, explanation thereof will be omitted, and the explanation of the first and second embodiments should be referred to.

The manufacturing process of the solid imaging device having the above pixel construction shown in FIG. 8 proceeds basically in the order of FIG. 5A through FIG. 5F, as in the first and second embodiments. However, in this embodiment, as in the case of the third embodiment (FIG. 7), the insulating layer 22 is formed at the same time that the insulating layers 16*a* and 16*b* are formed, and the P-type diffusion layers 15*a* and 15*b* are formed using the same process used to form the P-type diffusion layer 15 of the second embodiment, i.e., through the injection of P-type ions.

The manufacturing process of the solid imaging device shown in FIG. 5A through FIG. 5F is only a representative example. The device may alternatively be manufactured using a different manufacturing process.

According to this invention, because the pixels are formed in a substrate that includes a middle layer, the pixels may be insulated from each other with ease and precision. In addition, because each pixel has only two MOS transistors, the area that comprises a photoelectric conversion element, which is the sensitive unit, may be made larger than the conventional model. Therefore, the ratio of the light receiving area to the entire imaging area may be increased. The number of pixels may also be increased, or the device may be reduced in size. Further, because the device may be designed and manufactured using the standard C-MOS manufacturing process, manufacturing may be carried out using the same process by which circuits of other C-MOS devices are made.

Although preferred embodiments of the invention have been described in the foregoing detailed description and illustrated in the accompanying drawings, it will be understood that the invention is not limited to the embodiments disclosed, but is capable of numerous rearrangements, modifications and substitutions of parts and elements without departing from the spirit of the invention. Accordingly, the present invention is intended to encompass such rearrangements, modification and substitutions of parts and elements as fall within the spirit and scope of the invention.

What is claimed is:

1. A solid imaging device comprising:

a substrate including a semiconductor layer, a middle layer and a support layer;

multiple pixels that each have a photoelectric converter that includes a diffusion layer formed on a surface of the semiconductor layer; and an insulating part that is located from the surface of the semiconductor layer to the middle layer, wherein the insulating part works together with the middle layer to electrically separate the pixels from each other, wherein the middle layer is formed using a semiconductor material having an opposite conductivity type from that of the semiconductor layer.

2. A solid imaging device according to claim 1, further comprising a diffusion layer having the opposite conductivity type from that of the semiconductor layer, wherein the diffusion layer is located from the surface of the semiconductor layer to the middle layer.

3. A solid imaging device according to claim 1, wherein the conductivity type of the semiconductor substrate is P.

4. A solid imaging device according to claim 1, wherein the pixels are aligned in a matrix fashion.

5. A solid imaging device comprising:

a substrate including a semiconductor layer, a middle layer and a support layer;

multiple pixels that each have a photoelectric converter that includes a diffusion layer formed on a surface of the semiconductor layer; and an insulating part that is located from the surface of the semiconductor layer to the middle layer, wherein the insulating part works together with the middle layer to electrically separate the pixels from each other, wherein the multiple pixels each comprise:

first, second, third and fourth diffusion layers each having an opposite conductivity type from that of the semiconductor layer and are aligned on the surface of the semiconductor layer;

a first insulating film located on the semiconductor layer between the first and second diffusion layers;

a second insulating film located on the semiconductor layer between the third and fourth diffusion layers;

a first electrode film located on the first insulating film; and a second electrode film located on the second insulating film;

wherein the photoelectric converter comprises the second diffusion layer and the semiconductor layer and has a first electrode and a second electrode.

6. A solid imaging device according to claim 5, wherein the multiple pixels each include:

a first metal oxide semiconductor (MOS) transistor comprising the first diffusion layer, the second diffusion layer, the first insulating film and the first electrode film; and a second MOS transistor comprising the third diffusion layer, the fourth diffusion layer, the second insulating film and the second electrode film, wherein the first and second MOS transistors each have a first electrode, a second electrode and a gate electrode.

7. A solid imaging device according to claim 6, wherein the multiple pixels are each constructed such that the first electrode of the first MOS transistor is connected to the first electrode of the photoelectric conversion element, a back gate of the first MOS transistor is connected to the second electrode of the photoelectric conversion element such that the first MOS transistor outputs signals from the second electrode thereof, and the first electrode and a back gate of the second MOS transistor are connected to the second electrode of the photoelectric conversion element such that a reset DC voltage is impressed to the second electrode of the second MOS transistor.

8. A solid imaging device according to claim 6, wherein the second and third diffusion layers are separated from the middle layer.

9. A solid imaging device according to claim 6, wherein the first, second, third and fourth diffusion layers are separated from the middle layer.

10. A solid imaging device according to claim 5, further comprising:

an insulating area, which reaches from the surface of the semiconductor layer to the middle layer, wherein the insulating area is positioned between the second and third diffusion layers.

11. A solid imaging device according to claim 5, wherein the conductivity type of the semiconductor substrate is P.

12. A solid imaging device according to claim 5, wherein the pixels are aligned in a matrix fashion.

13. A solid imaging device according to claim 5, wherein the middle layer is formed using an insulating material.

* * * * *